(12) United States Patent
Hosomi et al.

(10) Patent No.: US 7,232,528 B2
(45) Date of Patent: Jun. 19, 2007

(54) SURFACE TREATMENT AGENT FOR COPPER AND COPPER ALLOY

(75) Inventors: Akira Hosomi, Kanagawa (JP); Naoki Kogure, Kanagawa (JP); Kenichi Moriyama, Kanagawa (JP); Kenichi Takahashi, Kanagawa (JP); Atsushi Hosoda, Kanagawa (JP); Kazuhiko Ikeda, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 95 days.

(21) Appl. No.: 10/481,018

(22) PCT Filed: Jun. 18, 2002

(86) PCT No.: PCT/JP02/06061

§ 371 (c)(1),
(2), (4) Date: Dec. 17, 2003

(87) PCT Pub. No.: WO03/000954

PCT Pub. Date: Jan. 3, 2003

(65) Prior Publication Data

US 2005/0061202 A1   Mar. 24, 2005

(30) Foreign Application Priority Data

Jun. 25, 2001 (JP) .............................. 2001-190660

(51) Int. Cl.
*H01L 21/302* (2006.01)
(52) U.S. Cl. ............... 252/79; 525/212; 525/362; 525/371; 525/377; 148/243; 148/283; 148/272; 148/282; 427/327; 427/226; 427/553; 427/558; 427/337; 427/333; 252/79.1; 252/79.4; 134/3; 134/41; 216/100; 216/102; 216/89; 216/99

(58) Field of Classification Search ............... 216/34, 216/13; 252/79.1–5
See application file for complete search history.

(56) References Cited

U.S. PATENT DOCUMENTS

| | | | | |
|---|---|---|---|---|
| 3,645,772 A | * | 2/1972 | Jones | 430/277.1 |
| 3,770,530 A | * | 11/1973 | Fujimoto | 216/50 |
| 5,532,094 A | * | 7/1996 | Arimura et al. | 216/106 |
| 5,869,130 A | * | 2/1999 | Ferrier | 148/251 |
| 6,146,701 A | * | 11/2000 | Ferrier | 427/327 |
| 2002/0081853 A1 | * | 6/2002 | Beitel et al. | 438/692 |
| 2003/0178391 A1 | * | 9/2003 | Johnson et al. | 216/105 |
| 2004/0099637 A1 | * | 5/2004 | Johnson | 216/83 |

FOREIGN PATENT DOCUMENTS

| | | | | |
|---|---|---|---|---|
| DE | 19927286 | * | 1/2001 | 438/692 |
| JP | 04182835 | * | 11/1992 | 438/692 |

* cited by examiner

*Primary Examiner*—Lan Vinh
*Assistant Examiner*—Patricia A. George
(74) *Attorney, Agent, or Firm*—Antonelli, Terry, Stout & Kraus, LLP.

(57) ABSTRACT

The surface treatment agent for copper and copper alloys contains hydrogen peroxide, a mineral acid, an azole compound, silver ion and a halide ion. The surface treatment agent for copper and copper alloys is useful in the production of printed wiring boards in electronics industry. The surface treatment agent roughens the surface of copper and copper alloys. Particularly, the surface treatment agent can form a uniform and undulation-free roughened surface on copper-clad substrates having plated mirror surface, this having been difficult in conventional techniques, thereby significantly improving the adhesion to etching resists, solder resists, in addition, to prepregs and a resin for mounting electronic parts.

11 Claims, No Drawings

SURFACE TREATMENT AGENT FOR COPPER AND COPPER ALLOY

TECHNICAL FIELD

The present invention relates to a surface treatment agent for copper and copper alloys, particularly, relates to a surface treatment agent for copper and copper alloys which is useful in the field of electronics industry for producing printed wiring boards, etc.

BACKGROUND ART

In the production of printed wiring boards, the surface of copper is polished to promote the adhesion between the copper surface and a resist before coating the copper surface with a dry film of etching photoresists, solder resists, etc. The polishing method may include a mechanical polishing such as a buff polishing and a chemical polishing effected by the contact with chemicals. In the treatment of substrates carrying fine wiring pattern, the chemical polishing is usually used. In the production of multi-layered printed wiring boards, it has been attempted to promote the adhesion between a copper electroconductive patterned layer and a resin layer, for example, by forming an oxide layer on the copper surface and reducing the oxide layer to metallic copper by a reducing agent while maintaining the geometric shape of the oxide layer.

Japanese Patent Application Laid-Open No. 51-27819 proposes to etch copper or copper alloys with a hydrogen peroxide/sulfuric acid-based aqueous solution containing 5-aminotetrazole. However, since the copper surface is difficult to be made uniform by the proposed method, a part of the copper surface is likely to be poor in the adhesion to the resist. To solve this problem, Japanese Patent Application Laid-Open No. 2000-297387 proposes a method to form a uniformly roughened surface on copper or copper alloys by the etching with a hydrogen peroxide/sulfuric acid-based aqueous solution containing 5-amino-1H-tetrazole and phenylurea.

DISCLOSURE OF INVENTION

An object of the present invention is to provide a surface treatment agent which is capable of making the surface of copper and copper alloys, particularly, the surface of electrolytic copper foil and copper plating used in the field of electronics industry into a uniformly roughened surface thereby to promote the adhesion to a resin layer such as resist layer, and capable of maintaining a time-wise stability of roughened copper surface during the course of continuous use. Another object of the present invention is to provide a method of roughening the copper surface.

As a result of extensive study to solve the above problems, the inventors have found that a surface treatment agent containing an azole compound, silver ion and a halide ion in addition to the main ingredient of hydrogen peroxide and a mineral acid makes the copper surface into a stably and uniformly roughened surface thereby to enhance the adhesion to the resin layer such as resist layer. On the basis of this finding, the present invention has been accomplished. Thus, the present invention relates to a surface treatment agent containing hydrogen peroxide, a mineral acid, an azole compound, silver ion and a halide ion.

BEST MODE FOR CARRYING OUT THE INVENTION

The concentration of hydrogen peroxide in the surface treatment agent may be in the range generally employed, and preferably 0.5 to 10% by weight and more preferably 0.5 to 5% by weight. If less than 0.5% by weight, a complicated control is needed and the etching rate is insufficiently low. If exceeding 10% by weight, the control of the etch amount is difficult because of excessively high etching rate.

The mineral acid usable in the present invention may include sulfuric acid, nitric acid, phosphoric acid, etc., which may be used alone or in combination. The concentration of the mineral acid may be in the range generally employed, and preferably 0.5 to 15% by weight. If less than 0.5% by weight, a troublesome control of the liquid is needed during its use for treatment. If exceeding 15% by weight, the solubility of copper is lowered to precipitate crystals of copper compounds in the step of dissolving copper.

The azole compound usable in the present invention may include benzotriazole, imidazole, 4-methylthiazole, 3-amino-1H-1,2,4-triazole, 1H-tetrazole, 5-methyl-1H-tetrazole, 5-phenyl-1H-tetrazole, and 5-amino-1H-tetrazole, with the tetrazole compounds and triazole compounds being preferred, and 5-amino-1H-tetrazole and benzotriazole being more preferred.

The concentration of the water-soluble azole compound is preferably 0.01 to 1% by weight, more preferably 0.05 to 0.5% by weight. If less than 0.01% by weight, the roughening effect is poor to fail in contributing to the improvement of adhesion. If exceeding 1% by weight, the dissolving speed of copper is lowered to undesirably reduce the productivity.

The silver ion source usable in the present invention may include silver nitrate, etc. The concentration of silver ion is preferably 0.1 to 3 ppm, more preferably 0.1 to 1.5 ppm. If less than 0.1 ppm, the roughening effect is poor to fail in contributing to the improvement of adhesion. If exceeding 3 ppm, the copper surface changes to black color because of an increased amount of deposited silver thereon.

The halide ion usable in the present invention may be at least one ion selected from the group consisting of chloride ion, bromide ion, iodide ion, hypochlorite ion and hypobromite ion, with chloride ion, bromide ion and iodide ion being preferred.

The concentration of halide ion is preferably 0.05 to 10 ppm, more preferably 0.1 to 5 ppm. If less than 0.05 ppm, the roughening effect is poor to fail in contributing to the improvement of adhesion. If exceeding 10 ppm, the dissolving speed of copper is lowered to undesirably reduce the productivity. Halogen compounds such as water-soluble halides, for example, sodium chloride, potassium bromide and potassium iodide, are used as the halide ion source.

The surface treatment agent of the present invention may further contain, if necessary, a known hydrogen peroxide stabilizer such as alcohols, organic carboxylic acids and organic amines, and an etching promoter, etc.

The surface treatment agent of the present invention may be prepared at the time of use by adding respective ingredients in predetermined contents. Apart of or all the ingredients may be blended in advance. For example, a concentrated aqueous solution may be used after added with the solution prepared in advance or diluted with water so as to reach the respective contents of ingredients as specified herein.

The method for treating a copper-clad substrate having an electrolytic copper foil and a copper plating substrate with the surface treatment agent of the present invention is not specifically limited. The treatment may be carried out by any of methods such as a spray method using a spray-etching machine, a shaking method in etching tank and a dipping method utilizing the circulation by pump. The treating temperature is not critical, and may be suitably selected from 20 to 50° C. according to the intended etching rate.

Since the degree of roughening of copper surface increases with increasing etching amount, the etching amount of copper surface may be suitable selected, usually, from 0.5 to 5 μm according to the intended degree of roughening. If less than 0.5 μm, the surface treatment is insufficient. Since an etching amount exceeding 5 μm provides no additional effect of surface treatment, an excessive etching for only roughening the surface is economically disadvantageous. However, the etching has an additional purpose, for example, for reducing the thickness of copper, the etching can be carried out with an etching amount exceeding 5 μm because the surface roughness can be maintained without practical disadvantage.

The copper concentration in the treating liquid is increased and the concentrations of the ingredients are reduced with the etching amount of copper. The content of each ingredient is calculated by analysis and the consumed ingredient is supplemented according to the results. The supplement can be effected by supplementing each consumed ingredient independently, or by adding a supplemental liquid which is prepared so as to compensate the consumed amount of each ingredient predetermined by the analysis on the dissolving amount of copper and the ingredients in the treating liquid. In both methods, a stable treated surface can be formed continuously. During the treatment, a part of the treating liquid is discarded, this preventing the precipitation of copper compound crystals due to the increase of copper concentration in the treating liquid.

The surface treatment agent of the present invention is suitably applicable not only to the pre-treatment for coating or applying resist and prepregs, but also to various pre-treatments in the production of printed wiring boards, more specifically, to pre-treatment for electroless plating, pre-treatment for electroplating, pre-treatment for pre-flux, pre-treatment for solder hot leveling, etc.

The present invention is described more in detail with reference to the examples. However, it should be noted that the following examples are merely illustrative and the scope of the present invention is not limited thereto.

EXAMPLE 1

A surface treatment agent containing 2% by weight of hydrogen peroxide, 9% by weight of sulfuric acid, 0.3% by weight of 5-amino-1H-tetrazole, 0.3 ppm silver nitrate (0.2 ppm of silver ion), and 0.3 ppm of sodium chloride (0.2 ppm of chloride ion) was prepared. An electroplated copper substrate (500×300 mm) was treated with 400 L of the surface treatment agent using a spray-etching machine at a spray pressure of 0.1 MPa. After adhering a dry film resist to the substrate, the exposure and development were carried out. Using a crosshatch guide, 11 lines with 1 mm intervals were scratched on the dry film resist to form a 10×10 checker pattern. An adhesive tape was applied to the checker pattern and peeled off into the vertical direction. The pieces of dry film resist which adhered to the adhesive tape was visually observed, and the adhesion was evaluated according to the following ratings.

A: no dry film resist adhered to adhesive tape.
B: 10% or less dry film resist adhered to adhesive tape.
C: 10 to 40% dry film resist adhered to adhesive tape.
D: 40% or more dry film resist adhered to adhesive tape.

EXAMPLE 2

The procedure of Example 1 was repeated except for using 1.5 ppm of potassium bromide (1 ppm of bromide ion) in place of sodium chloride.

EXAMPLE 3

The procedure of Example 1 was repeated except for using 0.5% by weight of 5-amino-1H-tetrazole, 0.9 ppm of silver nitrate (0.6 ppm of silver ion), and 0.4 ppm of potassium iodide (0.3 ppm of iodide ion) in place of sodium chloride.

EXAMPLE 4

The procedure of Example 1 was repeated except for using 0.4% by weight benzotriazole in place of 5-amino-1H-tetrazole, 0.5 ppm of silver nitrate (0.3 ppm of silver ion), and 0.8 ppm of sodium chloride (0.5 ppm of chloride ion).

EXAMPLE 5

The procedure of Example 1 was repeated except for using an electrolytic copper foil substrate in place of the electroplated copper substrate.

EXAMPLE 6

The procedure of Example 1 was repeated except for using 0.4% by weight of 1H-taetrazole in place of 5-amino-1H-tetrazole, 0.5 ppm silver nitrate (0.3 ppm of silver ion), 3 ppm potassium bromide (2 ppm of bromide ion), and an electrolytic copper foil substrate in place of the electroplated copper substrate.

COMPARATIVE EXAMPLE 1

A surface treatment agent containing 2% by weight of hydrogen peroxide and 9% by weight of sulfuric acid was prepared. An electroplated copper substrate (500×300 mm) was treated with 400 L of the surface treatment agent using a spray-etching machine at a spray pressure of 0.1 MPa. After adhering a dry film resist to the substrate, the exposure and development were carried out. Using a crosshatch guide, 11 lines with 1 mm intervals were scratched on the dry film resist to form a 10×10 checker pattern. An adhesive tape was applied to the checker pattern and peeled off into the vertical direction. The pieces of dry film resist which adhered to the adhesive tape was visually observed, and the adhesion was evaluated.

COMPARATIVE EXAMPLE 2

The procedure of Comparative Example 1 was repeated except for adding 0.8 ppm of silver nitrate (0.5 ppm of silver ion).

COMPARATIVE EXAMPLE 3

The procedure of Comparative Example 1 was repeated except for adding 1.3 ppm of sodium chloride (0.8 ppm of chloride ion).

COMPARATIVE EXAMPLE 4

The procedure of Comparative Example 1 was repeated except for adding 0.2% by weight of 5-amino-1H-tetrazole.

COMPARATIVE EXAMPLE 5

The procedure of Comparative Example 1 was repeated except for adding 0.5% by weight of benzotriazole and 1.5 ppm potassium bromide (1 ppm of bromide ion).

COMPARATIVE EXAMPLE 6

The procedure of Comparative Example 1 was repeated except for adding 0.3% by weight of 5-amino-1H-tetrazole and 0.8 ppm of silver nitrate (0.5 ppm of silver ion).

COMPARATIVE EXAMPLE 7

The procedure of Comparative Example 1 was repeated except for adding 0.2% by weight of 1H-tetrazole and 1.5 ppm potassium bromide (1 ppm of bromide ion) and using an electrolytic copper foil substrate in place of the electroplated copper substrate.

COMPARATIVE EXAMPLE 8

The procedure of Comparative Example 6 was repeated except for using an electrolytic copper foil substrate in place of the electroplated copper substrate.

TABLE 1

| Tetrazole compound | | Silver ion | Halide ion | | |
|---|---|---|---|---|---|
| kind | wt % | ppm | kind | ppm | Adhesion |
| Examples | | | | | |
| 1  5-amino-1H-tetrazole | 0.3 | 0.2 | Cl⁻ | 0.2 | A |
| 2  5-amino-1H-tetrazole | 0.3 | 0.2 | Br⁻ | 1 | A |
| 3  5-amino-1H-tetrazole | 0.5 | 0.6 | I⁻ | 0.3 | B |
| 4  benzotriazole | 0.4 | 0.3 | Cl⁻ | 0.5 | A |
| 5  5-amino-1H-tetrazole | 0.3 | 0.2 | Cl⁻ | 0.2 | A |
| 6  1H-tetrazole | 0.4 | 0.3 | Br⁻ | 2 | A |
| Comparative Examples | | | | | |
| 1  — | — | — | — | — | D |
| 2  — | — | 0.5 | — | — | D |
| 3  — | — | — | Cl⁻ | 0.8 | D |
| 4  5-amino-1H-tetrazole | 0.2 | — | — | — | D |
| 5  benzotriazole | 0.5 | — | Br⁻ | 1 | D |
| 6  5-amino-1H-tetrazole | 0.3 | 0.5 | — | — | C |
| 7  1H-tetrazole | 0.2 | — | Br⁻ | 1 | D |

As seen from Table 1, the surface treatment agent containing the water-soluble azole compound, silver ion and halide ion in addition to the main ingredients of hydrogen peroxide and mineral acid promotes the adhesion to the resist.

INDUSTRIAL APPLICABILITY

The surface treatment agent of the present invention roughens the surface of copper and copper alloys. Particularly, the surface treatment agent can form a uniform and undulation-free roughened surface on copper-clad substrates having plated mirror surface, this having been difficult in conventional techniques. Thus, the present invention provides a technique for significantly promoting the adhesion to etching resists, solder resists, in addition, to prepregs and a resin for mounting electronic parts. Therefore, the invention is of great industrial utility value.

What is claimed is:

1. A surface treatment agent containing hydrogen peroxide, a mineral acid, an azole compound, a silver ion, and a halide ion, wherein the surface treatment agent includes 0.01 to 1% by weight of the azole compound, 0.1 to 3 ppm of silver ion, 0.05 to 10 ppm of the halide ion, 0.5 to 15% by weight of the mineral acid, and 0.5 to 5% by weight of the hydrogen peroxide.

2. A surface treatment agent containing hydrogen peroxide, a mineral acid, an azole compound, a silver ion, and a halide ion, wherein the surface treatment agent includes 0.05 to 0.5% by weight of the azole compound, 0.1 to 3 ppm of silver ion, 0.05 to 10 ppm of the halide ion, 0.5 to 5% by weight of the hydrogen peroxide, and 0.5 to 15% by weight of the mineral acid.

3. A surface treatment agent containing hydrogen peroxide, a mineral acid, an azole compound, a silver ion, and a halide ion, wherein the surface treatment agent includes 0.05 to 0.5% by weight of the azole compound, 0.1 to 1.5 ppm of silver ion, 0.05 to 10 ppm of the halide ion, 0.5 to 5% by weight of the hydrogen peroxide, and 0.5 to 15% by weight of the mineral acid.

4. A surface treatment agent containing hydrogen peroxide, a mineral acid, an azole compound, a silver ion, and a halide ion, wherein the surface treatment agent includes 0.05 to 0.5% by weight of the azole compound, 0.1 to 1.5 ppm of the silver ion, 0.1 to 5 ppm of the halide ion, 0.5 to 5% by weight of the hydrogen peroxide, and 0.5 to 15% by weight of the mineral acid.

5. A surface treatment agent containing hydrogen peroxide, a mineral acid, an azole compound, a silver ion and a halide ion, wherein the surface treatment agent contains 0.01 to 1% by weight of the azole compound, 0.1 to 3 ppm of silver ion, 0.05 to 10 ppm of the halide ion, 0.5 to 10% by weight hydrogen peroxide, and 0.5 to 15% by weight mineral acid, and wherein the mineral acid is selected from the group consisting of sulfuric acid, nitric acid and phosphoric acid.

6. A surface treatment agent containing hydrogen peroxide, a mineral acid, an azole compound, a silver ion and a halide ion, wherein the surface treatment agent contains 0.01 to 1% by weight of the azole compound, 0.1 to 3 ppm of silver ion, 0.05 to 10 ppm of the halide ion, 0.5 to 10% by weight hydrogen peroxide, and 0.5 to 15% by weight mineral acid, and wherein the azole compound is a water-soluble azole compound.

7. A surface treatment agent containing hydrogen peroxide, a mineral acid, an azole compound, a silver ion and a halide ion, wherein the surface treatment agent contains 0.01 to 1% by weight of the azole compound, 0.1 to 3 ppm of silver ion, 0.05 to 10 ppm of the halide ion, 0.5 to 10% by weight hydrogen peroxide, and 0.5 to 15% by weight mineral acid, and wherein a source of the halide ion is selected from the group consisting of sodium chloride, potassium bromide and potassium iodide.

8. The surface treatment agent according to claim 7, wherein said halide ion is included in an amount of 0.1 to 5 ppm.

9. The surface treatment agent according to claim 1, wherein said halide ion is included in an amount of 0.1 to 5 ppm.

10. The surface treatment agent according to claim 7, wherein said halide ion is included in an amount of 0.05 to 5 ppm.

11. The surface treatment agent according to claim 1, wherein said halide ion is included in an amount of 0.05 to 5 ppm.

* * * * *